(12) United States Patent
Morita et al.

(10) Patent No.: US 11,445,605 B2
(45) Date of Patent: Sep. 13, 2022

(54) PRINTED WIRING BOARD, MULTILAYER PRINTED WIRING BOARD AND METHOD FOR MANUFACTURING PRINTED WIRING BOARD

(71) Applicant: TDK CORPORATION, Tokyo (JP)

(72) Inventors: Takaaki Morita, Tokyo (JP); Seiko Komatsu, Tokyo (JP); Seiichi Tajima, Tokyo (JP); Wakiko Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 66 days.

(21) Appl. No.: 16/916,229

(22) Filed: Jun. 30, 2020

(65) Prior Publication Data
US 2021/0014966 A1  Jan. 14, 2021

(30) Foreign Application Priority Data

Jul. 8, 2019 (JP) .............................. JP2019-127124

(51) Int. Cl.
| | | |
|---|---|---|
| H05K 1/03 | (2006.01) | |
| H05K 1/09 | (2006.01) | |
| H05K 1/11 | (2006.01) | |
| H05K 3/00 | (2006.01) | |
| H05K 1/02 | (2006.01) | |

(52) U.S. Cl.
CPC ......... *H05K 1/0333* (2013.01); *H05K 1/0298* (2013.01); *H05K 1/09* (2013.01); *H05K 1/115* (2013.01); *H05K 3/0011* (2013.01); *H05K 2201/0141* (2013.01); *H05K 2203/1105* (2013.01); *H05K 2203/1355* (2013.01)

(58) Field of Classification Search
CPC ...... H05K 1/0333; H05K 1/0298; H05K 1/09; H05K 1/115; H05K 1/0326; H05K 1/144; H05K 1/0313; H05K 1/0373; H05K 2201/0141; C09K 2219/11; C09K 19/38–3895
See application file for complete search history.

(56) References Cited

U.S. PATENT DOCUMENTS

| | | | | |
|---|---|---|---|---|
| 4,983,318 | A * | 1/1991 | Matsumoto | C09K 19/38 252/299.01 |
| 5,703,202 | A * | 12/1997 | Jester | B29C 71/02 438/782 |
| 5,952,718 | A * | 9/1999 | Ohtsuka | H01L 24/29 257/737 |
| 6,334,922 | B1 * | 1/2002 | Tanaka | H05K 3/4635 156/234 |
| 2003/0133275 | A1 | 7/2003 | Miyake et al. | |
| 2016/0262271 | A1 * | 9/2016 | Nazarenko | H05K 1/09 |
| 2019/0001628 | A1 * | 1/2019 | Nakashima | H05K 3/382 |

FOREIGN PATENT DOCUMENTS

JP    2003-332749 A    11/2003

* cited by examiner

*Primary Examiner* — Roshn K Varghese
(74) *Attorney, Agent, or Firm* — Oliff PLC

(57) ABSTRACT

A printed wiring board and the like in which local deviations of characteristics of a bamse member using a liquid crystal polymer are reduced. A printed wiring board uses a liquid crystal polymer having wiring formed on at least one surface as a bamse member, in which the bamse member has a degree of crystal orientation of the liquid crystal polymer of 0.3 or less in a plane direction.

13 Claims, 12 Drawing Sheets

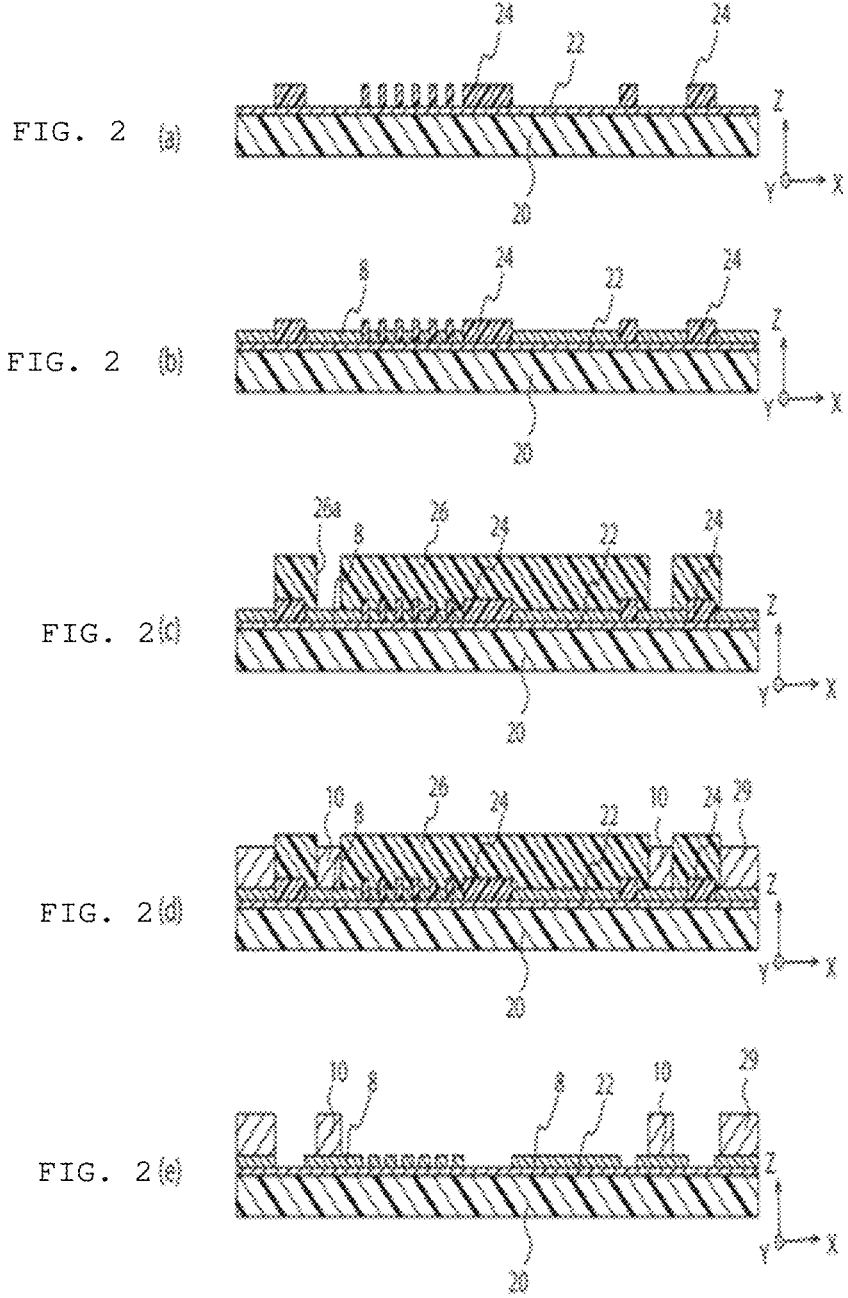

PRINTED WIRING BOARD, MULTILAYER PRINTED WIRING BOARD AND METHOD FOR MANUFACTURING PRINTED WIRING BOARD

BACKGROUND OF THE INVENTION

Field of the Invention

The present invention relates to a printed wiring board, a multilayer printed wiring board, and a method for manufacturing a printed wiring board.

Description of the Related Art

A thermoplastic resin is used as a base member of a printed wiring board on which a conductor pattern such as wiring is formed. The thermoplastic resin has advantageous properties as the bamse member of the printed wiring board, such as being easily multilayered by thermocompression bonding or the like.

Examples of the thermoplastic resin used for the printed wiring board include, for example, a liquid crystal polymer (LCP) (see JP 2003-332749A as Patent Document 1, etc.). The liquid crystal polymer has properties of working advantageously when used as the bamse member of the printed wiring board, for example, has excellent mechanical properties and has good thermal conductivity.

However, in the printed wiring board using the liquid crystal polymer, there is a problem that local deviations occur in physical properties of the liquid crystal polymer such as a dielectric constant or a dielectric loss. Since the dielectric constant or dielectric loss of the liquid crystal polymer affects characteristics of a circuit, an electronic component, or the like formed around the liquid crystal polymer, a problem such as a large manufacturing fluctuation in the characteristics of the circuit or the electronic component inside the printed wiring board may occur.

SUMMARY OF THE INVENTION

The present invention has been made in view of such circumstances, and relates to a printed wiring board, a multilayer printed wiring board, and a method for manufacturing a printed wiring board, in which local deviations of characteristics of a bamse member using a liquid crystal polymer are reduced.

In order to achieve the above object, a printed wiring board according to a first aspect of the present invention is a printed wiring board including a base member of a liquid crystal polymer having wiring formed on at least one surface, wherein the base member has a degree of crystal orientation of the liquid crystal polymer of 0.3 or less in a plane direction.

Inventors of the present invention have found that the local deviations of the characteristics of the bamse member using the liquid crystal polymer are caused by local deviations of molecular orientation of the liquid crystal polymer in the bamse member. In the printed wiring board according to the present invention, the degree of crystal orientation of the liquid crystal polymer in the plane direction of the bamse member is 0.3 or less, and therefore, the molecular orientation of the liquid crystal polymer is random with few deviations. Therefore, in the printed wiring board having the bamse member of such a liquid crystal polymer, the characteristics such as the dielectric constant or dielectric loss of the bamse member are uniform with few deviations in the bamse member, and manufacturing variations of characteristics of a circuit or an electronic component formed on the printed wiring board can also be reduced.

Further, a multilayer printed wiring board according to a second aspect of the present invention has: an insulating layer having a first main surface and a second main surface which have mutually parallel plane directions, and including a liquid crystal polymer having a degree of crystal orientation of the liquid crystal polymer of 0.3 or less in each of the plane directions; and a conductor portion including a wiring layer extending parallel to the second main surface and exposed from the second main surface, and a through-hole electrode extending from the wiring layer to the first main surface, at least a part of the conductor portion being embedded in the insulating layer to penetrate from the first main surface to the second main surface.

The printed wiring board including the insulating layer containing such a liquid crystal polymer has good mechanical properties. Since the degree of crystal orientation of the liquid crystal polymer in the plane direction of the insulating layer is 0.3 or less, the molecular orientation of the liquid crystal polymer is random with few deviations. Therefore, in the printed wiring board including the insulating layer containing such a liquid crystal polymer, the characteristics such as the dielectric constant or dielectric loss of the insulating layer are uniform with few deviations in the bamse member, and the manufacturing variations of the characteristics of the circuit or the electronic component formed on the printed wiring board can also be reduced. In addition, the insulating layer has good mechanical properties, electrical characteristics of the insulating layer has few local deviations, and the conductor portion has the through-hole electrode, so that such a printed wiring board is suitable for multilayering.

Further, for example, the insulating layer may include a reducing agent.

Such a printed wiring board can prevent a problem that the conductor portion is oxidated and an oxide film is formed on a surface of the conductor portion in a manufacturing process involving overheating, such as hot-pressing, by volatilization or decomposition of the reducing agent contained in the insulating layer. Further, since the oxide film can be prevented from being formed on the surface of the conductor portion, such a printed wiring board has good bondability between the conductor portions of layers when laminated.

Further, for example, the conductor portion may include a conductor connection film on a top surface of the through-hole electrode, and the conductor connection film includes at least one selected from Sn, Ag, Sn—Ag, Cu—Ag, or Sn—Cu.

Such a conductor connection film has good connectivity because the metal constituting the conductor connection film has a relatively low melting point.

In addition, the multilayer printed wiring board according to the present invention has a plurality of any one of the above-mentioned printed circuit boards, and are laminated such that the first main surface of one of the printed wiring boards and the second main surface of another of the printed wiring boards are in contact with each other.

In such a multilayer printed wiring board, since the insulating layer and the wiring layer are sandwiched by each other, the electrical characteristics of the insulating layer easily affect electrical characteristics of the circuit or electronic component by the wiring layer. However, in the multilayer printed wiring board according to the present invention, the degree of crystal orientation of the liquid crystal polymer in the plane direction of the insulating layer is 0.3 or less, and therefore, the molecular orientation of the liquid crystal polymer is random with few deviations. Therefore, in the multilayer printed wiring board including the insulating layer containing such a liquid crystal polymer, the characteristics such as the dielectric constant or dielectric loss of the insulating layer are uniform with few deviations in any part of the insulating layer, and intended characteristics of the circuit or electronic component of the multilayer printed wiring board can also be obtained with high accuracy.

In addition, a method for manufacturing a printed wiring board according to the present invention includes the steps of:

forming a conductor portion having a predetermined pattern;

coating a powder containing a liquid crystal polymer to a shaping place to move the powder in a vertical direction by dry coating; and hot-pressing the powder at a temperature equal to or higher than a melting point of the liquid crystal polymer.

In the method for manufacturing the printed wiring board according to the present invention, the powder containing the liquid crystal polymer is coated to the shaping place by moving the powder in the vertical direction. By such a step, the liquid crystal polymer can be prevented from flowing in the plane direction, and the insulating layer containing the liquid crystal polymer having a low degree of crystal orientation can be obtained. Therefore, according to such a manufacturing method, it is possible to obtain the printed wiring board in which the characteristics such as the dielectric constant or dielectric loss of the insulating layer are uniform with few deviations in the printed wiring board, and in which the characteristics of the circuit or the electronic component formed on the printed wiring board has few manufacturing variations.

Further, for example, in coating the powder, the conductor portion is disposed in the shaping place, and the powder is coated so as to fill at least a part of unevenness of the conductor portion.

In manufacture of the printed wiring board, it is possible to adopt a method of forming a liquid crystal polymer film and then forming a conductive portion on the film, whereas it is also possible to adopt a method of forming the conductor portion first and then coating the powder of the liquid crystal polymer to the conductor portion. By adopting a method of coating the powder of the liquid crystal polymer so as to fill at least a part of the unevenness of the conductor portion, a step of processing the film can be omitted to improve production efficiency.

Further, for example, the dry coating in coating the powder may be electrostatic coating.

The dry coating in coating the powder is not particularly limited, but the powder can be coated at high density by adopting the electrostatic coating. Therefore, according to such a manufacturing method, the liquid crystal polymer can be more effectively prevented from flowing in the plane direction, and the insulating layer containing the liquid crystal polymer having a low degree of crystal orientation can be obtained.

BRIEF DESCRIPTION OF THE DRAWINGS

FIG. 2(a)-FIG. 2(e) are schematic sectional views showing processes for manufacturing the printed wiring board and the multilayer printed wiring board shown in FIG. 1.

FIG. 8(a) is a diagram showing acquisition positions of the samples whose orientation states are measured, and FIG. 8(b) is a diagram showing measurement positions of the samples whose linear expansion coefficients are measured.

DETAILED DESCRIPTION OF THE PREFERRED EMBODIMENTS

Hereinafter, the present invention will be described based on embodiments shown in drawings.

Embodiment 1

Figure 1A:
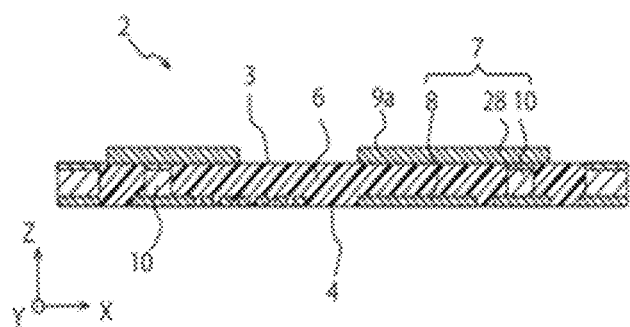
FIG. 1(a) and FIG. 1(b) are schematic sectional views of a printed wiring board and a multilayer printed wiring board according to an embodiment of the present invention.
Figure 1B:
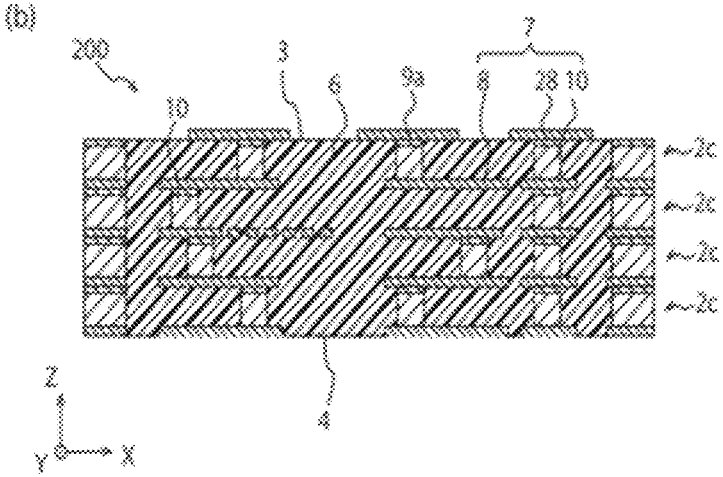

FIG. 1(a) is a schematic sectional view of a printed wiring board 2, and FIG. 1(b) is a schematic sectional view of a multilayer printed wiring board 200. As shown in FIG. 1(a), the printed wiring board 2 has an insulating layer 6, a conductor portion 7, and an upper wiring layer 9a. The insulating layer 6 is a bamse member of the printed wiring board 2, and wiring formed by a wiring layer 8, the upper wiring layer 9a, and the like is formed on both sides of the insulating layer 6 which is the bamse member. In the printed wiring board 2, the wiring is only required to be formed on at least one surface thereof, but may also be formed on both sides thereof as shown in FIG. 1(a).

As shown in FIG. 1(a), the insulating layer 6 is formed in a layer shape and has a first main surface 3 and a second main surface 4. The first main surface 3 and the second main surface 4 have plane directions parallel to each other. The conductor portion 7 is embedded in the insulating layer 6 such that a part of the conductor portion 7 is exposed from the main surfaces 3 and 4 of the insulating layer 6.

In the drawings, a Z-axis coincides with normal directions of the first main surface 3 and the second main surface 4 of the insulating layer 6, and an X-axis and a Y-axis are parallel to the first main surface 3 and the second main surface 4. The X-axis, the Y-axis, and the Z-axis are substantially perpendicular to each other.

The conductor portion 7 has the wiring layer 8, a through-hole electrode 10, and a conductor connection film 28. The conductor portion 7 is embedded in the insulating layer 6 such that at least a part of the conductor portion 7 penetrates from the first main surface 3 to the second main surface 4 of the insulating layer 6.

The wiring layer 8 provided on a lower side (Z-axis negative direction side) of the insulating layer 6 extends parallel to the second main surface 4 and is exposed from the second main surface 4. A lower end of the through-hole electrode 10 is connected to the wiring layer 8 exposed from the second main surface 4, and the through-hole electrode 10 extends from the wiring layer 8 on the second main surface 4 side toward the first main surface 3.

A top surface (end surface on a Z-axis positive direction side) of the through-hole electrode 10 is connected to the upper wiring layer 9a provided on the first main surface 3 via the conductor connection film 28. The conductor connection film 28 of the conductor portion 7 is provided on the top surface of the through-hole electrode 10.

As shown in FIG. 1(b), the multilayer printed wiring board 200 has a plurality of printed wiring boards 2c. Each printed wiring board 2c is the same as the printed wiring board 2 shown in FIG. 1(a) except a difference that the upper wiring layer 9a is not formed and the wiring is formed only on one surface. A printed wiring board in which the wiring layer 8 is formed only on one surface (second main surface 4) as in the printed wiring board 2c may be used not only as a single-layer printed wiring board having only one insulating layer 6 but also as a single-sided wiring board for a multilayer printed wiring board as an intermediate product when the multilayer printed wiring board 200 having a plurality of insulating layers 6 is manufactured.

The multilayer printed wiring board 200 is laminated such that the first main surface 3 of one printed wiring board 2c and the second main surface 4 of another printed wiring board 2c (see FIG. 1) are in contact with each other. That is, in the multilayer printed wiring board 200, a plurality of printed wiring boards 2c are laminated in a Z-axis direction.

Similarly to the printed wiring board 2 shown in FIG. 1(a), each printed wiring board 2c included in the multilayer printed wiring board 200 has the insulating layer 6 and the conductor portion 7, and the conductor portion 7 has the wiring layer 8, the through-hole electrode 10, and the conductor connection film 28. Further, the upper wiring layer 9a is provided on an upper surface of the multilayer printed wiring board 200.

The multilayer printed wiring board 200 has the plurality of insulating layers 6 laminated in the Z-axis direction. Each wiring layer 8 disposed between the insulating layers 6 adjacent to each other in a laminating direction is an intermediate wiring layer embedded inside the multilayer printed wiring board 200.

As shown in FIG. 1(b), each insulating layer 6 is formed with through-holes penetrating in the Z-axis direction, and the through-hole electrodes 10 (the "through-hole electrode" is also referred to as a "conductor post") are embedded therein in order to connect the wiring layers 8 located on different printed wiring boards 2c to each other.

The insulating layers 6 of the printed wiring boards 2 and 2c shown in FIG. 1(a) and FIG. 1(b) include a liquid crystal polymer (LCP). A structure of the LCP is not particularly limited. Examples of the structure of the LCP include a structure represented by the following Chemical Formula (1).

[Chemical Formula 1]

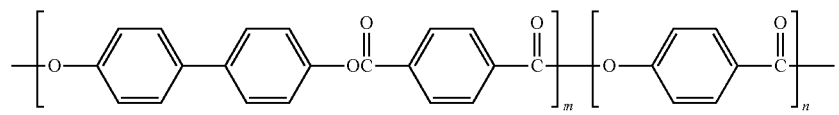

Chemical Formula 1

The liquid crystal polymer, which is contained in the insulating layer 6 and which is the bamse member of the printed wiring boards 2 and 2c and the multilayer printed wiring board 200, has a degree of crystal orientation of 0.3 or less in a plane direction parallel to an XY plane and the main surfaces 3 and 4. The degree of crystal orientation herein is different from that calculated from an orientation half width, and is defined as follows. The degree of crystal orientation calculated by the following calculation method is also referred to as an orientation intensity ratio, and is suitable for calculating the degree of crystal orientation in a material having a relatively low orientation.

That is, the degree of crystal orientation of the liquid crystal polymer is calculated from the following Equation 1 by cutting out peripheries of angles of a maximum intensity and a minimum intensity in a circumferential (φ) profile from a two-dimensional diffraction image obtained by a wide-angle X-ray diffraction method.

degree of crystal orientation=(maximum peak area− minimum peak area)/maximum peak area   (Equation 1)

The maximum peak area in Equation 1 is an integrated value of a peak intensity at the maximum intensity peak, and the minimum peak area is an integrated value of a peak intensity at the minimum intensity peak.

The insulating layers 6 of the printed wiring boards 2 and 2c shown in FIG. 1(a) and FIG. 1(b) have a reducing agent. The reducing agent contained in the insulating layer 6 of this embodiment is not particularly limited. Examples of the reducing agent contained in the insulating layer 6 of this embodiment include an organic compound having a carboxyl group and an aldehyde group and the like.

Examples of the organic compound include a saturated fatty acid, an unsaturated fatty acid, an aromatic carboxylic acid, a dicarboxylic acid, an oxocarboxylic acid, a rosin, and the like. As the reducing agent, one type of the reducing agents may be used alone, or two or more types may be used in combination.

Examples of the saturated fatty acid include formic acid, propionic acid, and the like. Examples of the unsaturated fatty acid include oleic acid, linoleic acid, and the like. Examples of the aromatic carboxylic acid include benzoic acid, phthalic acid, terephthalic acid, salicylic acid, and the like. Examples of the dicarboxylic acid include oxalic acid, malonic acid, glutaric acid, fumaric acid, maleic acid, and the like. Examples of the oxocarboxylic acid include pyruvic acid, oxaloacetic acid, and the like.

In this embodiment, since the LCP is contained in the insulating layer 6, an aromatic carboxylic acid is preferably used as the reducing agent. An aromatic carboxylic acid has an affinity with an LCP having a benzene ring, and therefore can be uniformly distributed in the insulating layer 6.

T2, which is a boiling point, a decomposition temperature, or a sublimation temperature of the reducing agent, is preferably 100 to 300° C., and more preferably 200 to 250° C. As a result, in manufacture of the multilayer printed wiring board 200, the reducing agent does not volatilize excessively during sheet shaping hot-pressing described below, and the reducing agent can volatilize at a temperature during collective laminating hot-pressing described below, and can exhibit an effect of removing an oxide film.

In this embodiment, the reducing agent contained in the insulating layer 6 is preferably at least one selected from benzoic acid, phthalic acid, terephthalic acid, or salicylic acid, more preferably benzoic acid or salicylic acid.

A boiling point of benzoic acid is 249° C., a decomposition temperature of phthalic acid is 210° C., a sublimation temperature of terephthalic acid is 300° C., and a boiling point of salicylic acid is 211° C.

A content of the reducing agent in the insulating layer 6 of this embodiment is preferably 30 to 200 mass ppm, and more preferably 50 to 100 mass ppm.

When the content of the reducing agent in the insulating layer 6 is within the above range, the effect of removing the oxide film can be obtained, and generation of voids in the insulating layer 6 due to the reducing agent can be suppressed.

The wiring layer 8 or the upper wiring layer 9a is not particularly limited as long as having conductivity and can be easily patterned, and is made of, for example, Cu, Ni, Ti, Ag, Al, Au, Zn, Mo, an alloy thereof, or the like. The through-hole electrode 10 is also made of the same metal (including an alloy) as the wiring layer 8, but is not necessarily the same. The wiring layer 8 and the upper wiring layer 9a are made of the same metal, but are not necessarily the same.

The conductor connection film 28 is preferably made of a metal having a lower melting point than that of the metal constituting the wiring layer 8 or the through-hole electrode 10. The melting point of the metal constituting the conductor connection film 28 is preferably lower than a temperature at which the insulating layer 6 is fused in the laminating direction by hot-pressing. At the same time as the hot-pressing, the through-hole electrode 10 can be connected to the wiring layer 8 or the upper wiring layer 9a via the conductor connection film 28.

The metals constituting the conductor connection film 28 is not particularly limited, and examples thereof include Sn, Ag, Sn—Ag, Cu—Ag, Sn—Cu, and the like. The metal constituting the conductor connection film 28 is preferably made of a material whose melting point is slightly lower than a melting point (softening temperature) of a resin constituting the insulating layer 6, more preferably a material whose melting point is about 10 to 50° C. lower than the melting point of the resin constituting the insulating layer 6, and further preferably a material whose melting point is about 20 to 40° C. lower than the melting point of the resin constituting the insulating layer 6.

T1, which is the melting point of the LCP included in the insulating layer 6, T2 (boiling point, decomposition temperature or sublimation temperature of the reducing agent), and T3, which is the melting point of the metal constituting the conductor connection film 28, preferably satisfy the relationship of T2≤T3<T1.

This makes it possible to volatilize the reducing agent and to prevent damage to the structure of the insulating layer 6 due to excessive heat while melting the metal constituting the conductor connection film 28 during hot-pressing in a manufacturing process.

Specifically, T3 is preferably about 10 to 50° C., more preferably about 20 to 40° C. lower than T1.

Further, T3 is preferably about 0 to 40° C., more preferably about 10 to 30° C. higher than T2.

In this embodiment, a thickness of each insulating layer 6 in the Z-axis direction is not particularly limited, but is preferably 30 to 100 μm. The thickness of each insulating layer 6 corresponds to a height of each through-hole electrode 10 in the Z-axis direction. A thickness of the wiring layer 8 is not particularly limited, but is preferably 5 to 20 μm. In addition, a thickness of the conductor connection film 28 is not particularly limited, but is preferably 0.2 to 5.0 μm.

A pattern line width of the wiring layer 8 is not particularly limited, but is preferably 20 μm or less, more preferably 10 μm or less, and particularly preferably 7 μm or less. An outer diameter of the through-hole electrode 10 is not particularly limited, but is usually φ 100 to 50 μm, and can also be manufactured at 50 μm or less.

Next, a method for manufacturing the printed wiring board 2 shown in FIG. 1(a) will be described in detail.

First, a support substrate 20 shown in FIG. 2(a) is prepared. The support substrate 20 is not particularly limited, and examples thereof include a metal plate such as an SUS plate, a resin sheet such as a polyimide film, a glass epoxy substrate, a glass epoxy substrate, other heat resistant substrates, and the like. The support substrate 20 may be any material that can be handled and has heat resistance that can withstand a pressing temperature (melting temperature) of a resin layer made of a thermoplastic resin.

As shown in FIG. 2(a), it is preferable that a base conductor film 22 is previously formed on a surface of the support substrate 20. However, the base conductor film 22 may be prepared separately from the support substrate 20, and the prepared base conductor film 22 may be attached to the surface of the support substrate 20. The base conductor film 22 is a film serving as a seed for forming a plating film in a later step, and is made of, for example, a metal film of Cu, a copper alloy, or the like.

The base conductor film 22 may be formed on the surface of the support substrate 20 by sputtering or the like, but is preferably formed by a method in which the support substrate 20 can be peeled off together with the support substrate later. For example, a thermoplastic polyimide substrate is used as the support substrate 20, and an ultra-thin copper foil attached with a carrier is attached thereto to improve handling property, but the ultra-thin copper foil attached with the carrier itself may be used as the support substrate 20 attached with the base conductor film 22.

Next, as shown in FIG. 2(a), a first resist film 24 is formed in a predetermined pattern on the base conductor film 22 of the prepared support substrate 20.

Next, as shown in FIG. 2(b), by using the first resist film 24 having the predetermined pattern, the wiring layer 8 is formed on a part of a surface of the base conductor film 22 that is not covered with the first resist film 24 by a plating method using, for example, the base conductor film 22 as a seed. The wiring layer 8 is formed by electrolytic copper plating, for example.

Next, as shown in FIG. 2(c), in a state where the first resist film 24 is left, a second resist film 26 is formed in a predetermined pattern on the surface of the wiring layer 8. In the second resist film 26, a through-hole 26a is formed in a pattern for forming the through-hole electrode 10 shown in FIG. 1. The second resist film 26 shown in FIG. 2(c) may be formed in a predetermined pattern after the first resist film 24 is removed.

Next, as shown in FIG. 2(d), the through-hole electrode 10 is formed on a part of the surface of the wiring layer 8 that is not covered with the second resist film 26 by the electrolytic copper plating, for example.

A frame body 29 may be formed along an outer peripheral frame of the support substrate 20. The frame body 29 is used to, when a raw material powder for forming the insulating layer 6 is coated onto the wiring layer 8, prevent a raw material powder from protruding outward in a later step. The frame body 29 may be removed from a final product or may be left.

Next, as shown in FIG. 2(e), the first resist film 24 and the second resist film 26 shown in FIG. 2(d) are removed. As a result, the wiring layer 8 having a predetermined pattern is left on the surface of the base conductor film 22. The through-hole electrode 10 is connected to and left on a part of the wiring layer 8.

In addition, in this embodiment, the outer diameter of the through-hole electrode 10 is preferably smaller than a line width of the wiring layer 8. As described above, the line width of the wiring layer 8 can be preferably 10 µm or less, and more preferably 7 µm or less. The outer diameter of the through-hole electrode 10 is not particularly limited as long as electrical resistance is not too high. The outer diameter of the through-hole electrode 10 is often larger than that of a minimum wiring portion of the pattern thereof.

Figure 3:
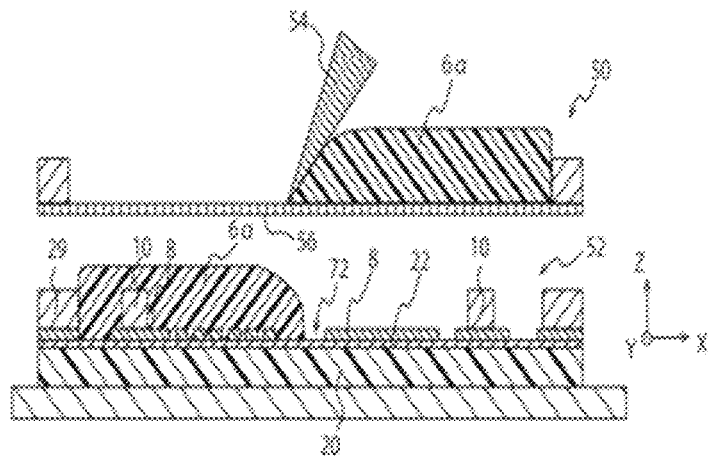
FIG. 3(a)-FIG. 3(c) are schematic sectional views showing a step subsequent to that in FIG. 2.
Figure 3:
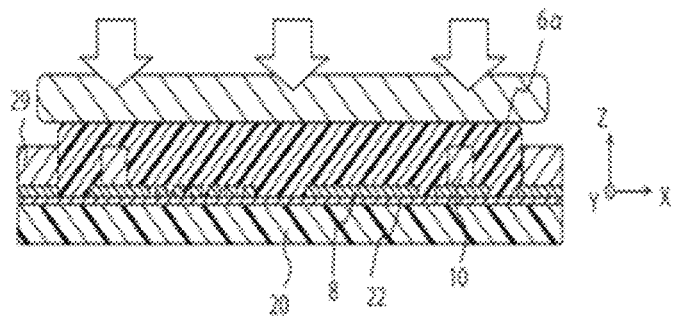
Figure 3:
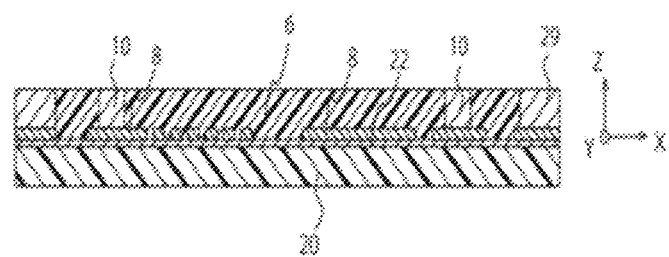

Next, as shown in FIG. 3(a), a powder 6a containing the LCP is coated so as to fill at least a part of an unevenness 72 of the surface of the base conductor film 22 of the support substrate 20 and the wiring layer 8 and the through-hole electrode 10 as a part of the conductor portion 7 (see FIG. 1(a)). A coating method is not particularly limited, and examples thereof include screen printing, electrostatic printing, nozzle spraying, a dispense method, and the like. As the coating method of the powder 6a in this embodiment, more preferably, by using the electrostatic printing using a screen printing plate, even if a powder 6a not containing a solvent or the like is dry coated the powder 6a can be coated and fixed only to predetermined portions, and can be coated without mixing with a resin powder for an insulating layer to be coated later.

FIG. 3(a) shows a step of coating the powder 6a containing the LCP by a screen printing machine 50. As shown in FIG. 3(a), a squeegee 54 moving on a screen mesh 56 is used to coat the powder 6a containing the LCP to a shaping place 52 of the support substrate 20 on which the wiring layer 8, the through-hole electrode 10, and the like formed in FIG. 2(e) are formed.

As shown in FIG. 3(a), an inside portion of the frame body 29 formed so as to surround the wiring layer 8, the through-hole electrode 10, and the like is the shaping place 52 to be subjected to coating by the screen printing machine 50. In the screen printing machine 50, the powder 6a is coated to the shaping place 52 by moving the powder 6a in a vertical direction from the screen mesh 56.

Figure 6:
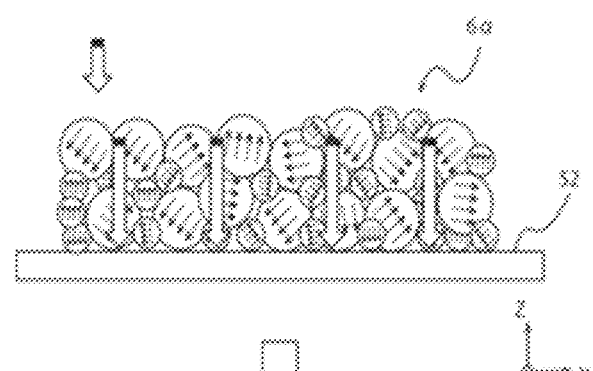
FIG. 6(a) and FIG. 6(b) are conceptual diagrams showing an alignment state in a powder coating step shown in FIG. 4.
Figure 6:
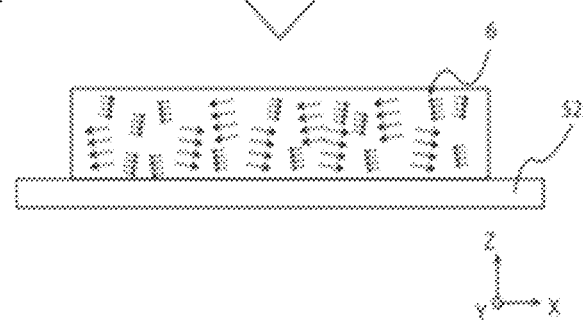

FIG. 6 schematically shows a state of crystal orientation of the liquid crystal polymer in the insulating layer 6 obtained by, as illustrated in FIG. 3(a), coating the powder 6a to the shaping place 52 by moving the powder 6a in the vertical direction and then hot-pressing the powder 6a. As shown in FIG. 6(a), according to the screen printing in which the powder 6a is coated to the shaping place 52 by moving the powder 6a in the vertical direction, the powder 6a hardly flows in an XY plane direction, that is, in the plane direction.

Dotted arrows in FIG. 6(a) show molecular orientation of the liquid crystal polymer contained in the powder 6a. The liquid crystal polymer has a property that when flowing in a predetermined direction, deviations of the molecular orientation occur depending on the flow direction, but as shown in FIG. 6(a), as long as the flow in the plane direction does not occur, the molecular orientation of the liquid crystal polymer is in a random state with few deviations.

Then, as shown in FIG. 6(b), the insulating layer 6 obtained by hot-pressing the powder 6a can also be obtained in a random state with few deviations of the molecular orientation of the liquid crystal polymer. By performing the step of coating the powder 6a by moving the powder 6 in the vertical direction by electrostatic screen printing, movement of the powder 6a in the vertical direction is accelerated by an electrostatic force. Therefore, by coating the powder 6a by the electrostatic screen printing, the powder 6a to be printed is densified, which suppresses the flow of the liquid crystal polymer in the plane direction during hot-pressing under a pressure, and thus it is possible to obtain the insulating layer 6 with few deviations in the molecular orientation of the liquid crystal polymer.

Figure 7:
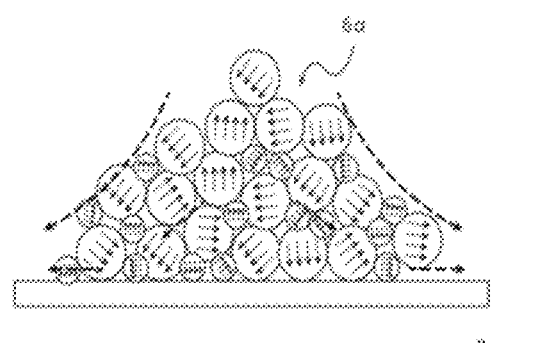
FIG. 7(a) and FIG. 7(b) are conceptual diagrams showing an alignment state in a conventional coating step.
Figure 7:
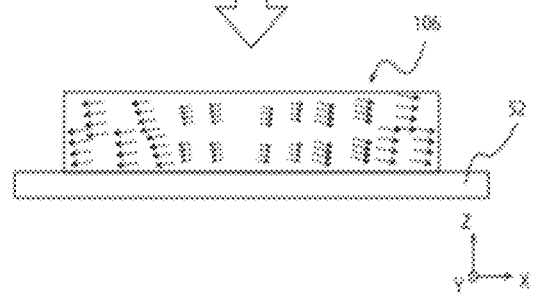

FIG. 7 schematically shows a state of the crystal orientation of the liquid crystal polymer in a reference insulating layer 106 obtained by coating the powder 6a to the shaping place 52 by moving the powder 6a in a parallel direction or an oblique direction (FIG. 7(a)), which is unlike the coating method shown in FIG. 3(a), and then hot-pressing the powder 6a. In such a reference insulating layer 106, as shown in FIG. 7(a) and FIG. 7(b), deviations of the molecular orientation of the liquid crystal polymer occur depending on a flow direction, and therefore, the degree of orientation increases.

The powder 6a shown in FIG. 3(a) is a resin powder for forming the insulating layer 6 shown in FIG. 1, and preferably has a melting point of 250 to 350° C.

A structure of a compound constituting the powder 6a containing the LCP is not particularly limited. A particle size of the powder 6a is preferably 5 to 50 µm.

The powder 6a may contain a reducing agent in addition to a LCP powder. A concentration of the reducing agent in the powder 6a is not particularly limited. In this embodiment, the concentration of the reducing agent in the powder 6a may be determined in consideration of heat treatment conditions and the like so that a reducing component is contained, in an amount of 30 to 200 mass ppm, and more preferably 50 to 100 mass ppm, in a sheet formed by heat-treating an insulating resin powder.

When the content of the concentration in the powder 6a is within the above range, the effect of removing the oxide film can be obtained, and the generation of the voids in the insulating layer 6 due to the reducing agent can be suppressed.

The powder 6a may contain other components as necessary, in addition to the LCP powder and the reducing agent.

Next, as shown in FIG. 3(b), the powder 6a is melted by hot-pressing (sheet shaping hot-pressing) from an upper side of the Z-axis to form the sheet-like insulating layer 6 shown in FIG. 3(c). The temperature during sheet forming hot-pressing is preferably a temperature equal to or higher than the melting point of the liquid crystal polymer constituting the powder 6a and equal to or lower than a thermal decomposition temperature of the liquid crystal polymer constituting the powder 6a, and more preferably a temperature about 10 to 50° C. higher than the melting point of the LCP constituting the powder 6a. Further, a pressure during sheet shaping hot-pressing is not particularly limited as long as being a pressure sufficient to shape the sheet-like insulating layer 6 having a predetermined thickness from the powder 6a.

In addition, in order to flatten an upper surface of the insulating layer 6, and to remove excess portions of the insulating layer 6 attached to the top of the through-hole electrode 10 as necessary, the upper surface of the insulating layer 6 shown in FIG. 3(c) may be polished. A polishing method is not particularly limited, and examples thereof include a chemical mechanical polishing (CMP) method, a grindstone polishing method, a fly cutting method, and the like.

The concentration of the reducing agent in the sheet-like insulating layer 6 after the sheet shaping hot-pressing is preferably 30 to 200 mass ppm, and more preferably 50 to 100 mass ppm.

When the content of the reducing agent in the sheet-like insulating layer 6 after the sheet shaping hot-pressing is within the above range, the effect of removing the oxide film can be obtained, and the generation of the voids in the insulating layer 6 due to the reducing agent can be suppressed.

In addition, although the reducing agent is contained in the powder 6a before the sheet shaping hot-pressing, a part of the reducing agent may volatilize during sheet shaping hot-pressing. Therefore, the concentration of the reducing agent in the sheet-like insulating layer 6 after the sheet shaping hot-pressing is lower than the concentration of the reducing agent in the powder 6a.

Figure 4:
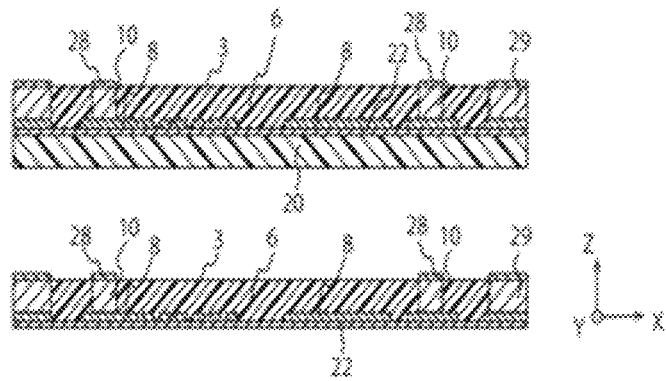
FIG. 4(a)-FIG. 4(g) are schematic sectional views showing a step subsequent to that in FIG. 3.
Figure 4:
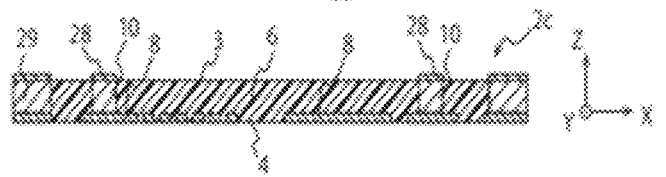
Figure 4:
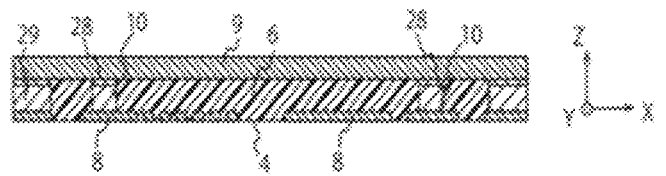
Figure 4:
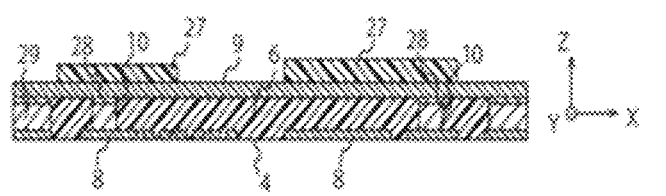
Figure 4:
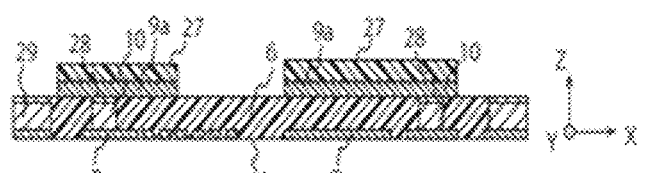

Next, as shown in FIG. 4(a), the conductor connection film 28 is formed on the top of the through-hole electrode 10. Examples of a method for forming the conductor connection film 28 on the top of the conductor post include a plating method, an electrolytic plating method, an electroless plating method, a sputtering method, and the like.

The conductor connection film 28 is made of a metal having a melting point lower than the melting point of the metal constituting the through-hole electrode 10 or the wiring layer 8.

Next, as shown in FIG. 4(b), the support substrate 20 is removed.

Next, as shown in FIG. 4(c), the base conductor film 22 is removed. The support substrate 20 and the base conductor film 22 are removed by etching using a liquid or the like. Thus, the other main surface 4 of the insulating layer 6 is exposed, and the printed wiring board 2c having the wiring formed on only one surface is obtained.

Next, as shown in FIG. 4(d), a conductor layer 9 is formed on the one main surface 3 of the insulating layer 6 shown in FIG. 4(d). The conductor layer 9 is formed by, for example, bonding a material of the conductor layer 9 such as a copper foil body by hot-pressing. Examples of the material of the conductor layer 9 include a metal that is a good conductor, similarly to the material of the wiring layer 8 or the through-hole electrode 10.

Next, as shown in FIG. 4(e), a third resist film 27 is formed on the conductor layer 9 in a predetermined pattern. The third resist film 27 is formed by photolithography or the like.

Next, as shown in FIG. 4(f), a portion of the conductor layer 9 exposed from the third resist film 27 is removed by etching. With a part of the conductor layer 9 removed, the portion left serves as the upper wiring layer 9a.

Finally, as shown in FIG. 4(g), the printed wiring board 2 shown in FIG. 1(a) is obtained by removing the third resist film 27.

Next, a method for manufacturing the multilayer printed wiring board 200 shown in FIG. 1(b) will be described in detail. In manufacture of the multilayer printed wiring board 200, the printed wiring board 2c shown in FIG. 4(c) is manufactured by the same method as those described with reference to FIG. 2(a) to FIG. 2(e), FIG. 3(a) to FIG. 3(c), and FIG. 4(a) to FIG. 4(c) among the methods for manufacturing the printed wiring board 2.

Figure 5:
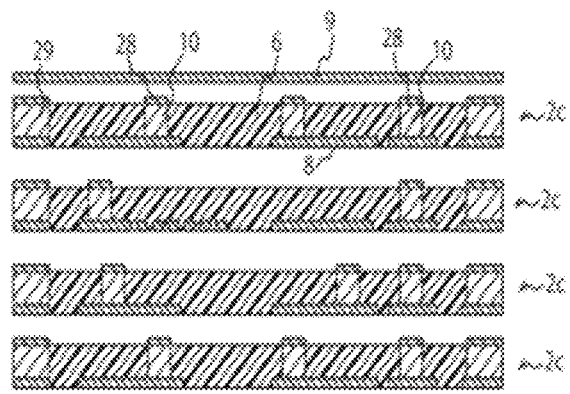
FIG. 5(a)-FIG. 5(c) are schematic sectional views showing a step subsequent to that in FIG. 4.
Figure 5:
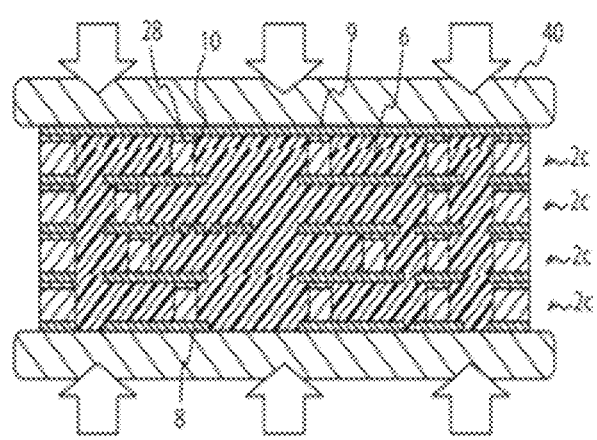
Figure 5:
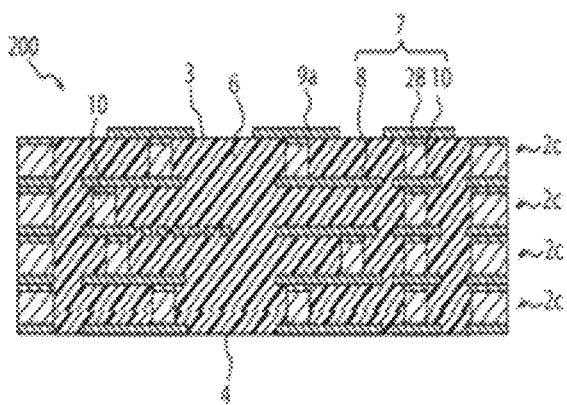

As shown in FIG. 5(a), In manufacture of the multilayer printed wiring board 200, the printed wiring board 2c on which the wiring is formed on only one surface is used as the single-sided wiring board for the multilayer printed wiring board as the intermediate product when the multilayer printed wiring board 200 is manufactured. In this embodiment, an example is shown in which four printed wiring boards 2c and the conductor layer 9 are prepared, but the number of the printed wiring boards 2c is not particularly limited.

As shown in FIG. 5(b), these printed wiring boards 2c and the conductor layer 9 are collectively laminated and hot-pressed by a hot-pressing device 40. Unlike examples shown in FIG. 5(a) and FIG. 5(b), only the printed wiring boards 2c may be collectively laminated and hot-pressed, and the conductor layer 9 may be bonded after collective laminating hot-pressing. The conductor layer 9 attached after collective laminating hot-pressing or hot-pressing is patterned by forming a resist film in a predetermined pattern and then performing etching or the like, so as to form the upper wiring layer 9a as shown in FIG. 5(c).

During the collective laminating hot-pressing, the insulating layers 6 adjacent to each other in the laminating direction are thermally fused, and the conductor connection films 28 having a low melting point are melted to connect the through-hole electrodes 10 and the wiring layers 8 and to connect the through-hole electrodes 10 and the conductor layer 9. The temperature during collective laminating hot-pressing is preferably a temperature equal to or lower than the melting point of the LCP contained in the insulating layers 6, and is preferably higher than the melting point of the conductor connection films 28.

In this way, the multilayer printed wiring board 200 shown in FIG. 1(b) can be manufactured.

In the printed wiring board 2 shown in FIG. 1(a) and the multilayer printed wiring board 200 shown in FIG. 1(b), the degree of crystal orientation of the liquid crystal polymer in the plane direction of the insulating layer 6 is 0.3 or less, and therefore, the molecular orientation of the liquid crystal polymer is random with few deviations. Therefore, in the printed wiring board 2 and the multilayer printed wiring board 200 having the insulating layer 6 containing such a liquid crystal polymer, the characteristics such as the dielectric constant and dielectric loss of the insulating layer 6 are uniform with few deviations in any part of the insulating layer 6, and the manufacturing variations of the characteristics of the circuit or the electronic component formed on the printed wiring board 2 and the multilayer printed wiring board 200 can also be reduced. Further, when the degree of crystal orientation of the liquid crystal polymer in the plane direction of the insulating layer 6 is equal to or less than a predetermined value, the multilayer printed wiring board 200 can suppress deviations due to a position and a direction in terms of not only electrical characteristics but also thermal and mechanical characteristics such as a difference in a linear expansion coefficient, and can obtain uniform characteristics.

Further, as described with reference to FIG. 3(a), in the method for manufacturing the printed wiring board 2, the powder 6a having the liquid crystal polymer is coated to the shaping place 52 by moving the powder 6a in the vertical direction. According to such a manufacturing method, the powder 6a is prevented from flowing in the plane direction in the shaping place 52, and therefore, the molecular orientation of the liquid crystal polymer obtained after the hot-pressing is in a random state with few deviations (see FIG. 6). Therefore, according to such a manufacturing method, it is possible to obtain the multilayer printed wiring board 200 in which the degree of crystal orientation of the liquid crystal polymer in the plane direction of the insulating layer 6 is equal to or less than the predetermined value.

Further, in a conventional manufacturing method, when collective lamination as shown in FIG. 1(b) is performed, a problem may occur in bondability between the printed wiring boards 2c.

When Sn, Ag, Sn—Ag, Cu—Ag, Sn—Cu, Sn—Ni, Sn—Zn, or the like is used as the metal constituting the conductor connection films 28, oxide films are formed on the surfaces of the conductor connection films 28. Even when the conductor connection films 28 are not formed, oxide films are formed on surface portions of the conductor posts 10a exposed to air when the conductor posts 10a are made of Cu or the like.

When the oxide films are formed on the surfaces of the conductor connection films 28 in this manner, the metal constituting the conductor connection films 28 are hard to melt during collective laminating hot-pressing, voids may be generated, and it is difficult to wet and spread the metal constituting the conductor connection films 28 over the entire surfaces of the through-hole electrodes 10. As a result, connection between the through-hole electrodes 10 and the wiring layers 8 tends to be insufficient.

In addition, when the conductor connection films 28 are not formed and the through-hole electrodes 10 are made of Cu or the like, the connection between the through-hole electrodes 10 and the wiring layers 8 is insufficient when the oxide films are formed on the surface portions of the through-hole electrodes 10 exposed to the air.

In order to remove the oxide films, it is considered to form a reducing atmosphere by formic acid or the like during collective laminating hot-pressing. However, since the collective laminating hot-pressing is required to be performed in vacuum in order to prevent the voids due to air residues between the layers, it is impossible to form the reducing atmosphere.

In addition, it is also considered to coat a flux to remove the oxide films. However, there is a demand to avoid the use of the flux, which is affected by residues, as much as possible.

In this embodiment, the powder 6a contains the reducing agent. Therefore, even when the collective laminating hot-pressing is performed in an air atmosphere, the oxide films formed on the surfaces of the conductor connection films 28 can be removed by causing the reducing agent to volatilize or decompose during collective laminating hot-pressing.

As a result, the metal constituting the conductor connection films 28 is easy to melt during collective laminating hot-pressing, the voids are less likely to be generated, the metal constituting the conductor connection films 28 can be wetted and spreaded over the entire surfaces of the through-hole electrodes 10, and a connection of the through-hole electrodes 10 to the wiring layers 8 and the upper wiring layer 9a is good. In this embodiment, the flux may or may not be coated to the through-hole electrodes 10.

Further, in this embodiment, the melting point of the conductor connection films 28 is lower than the melting point of the wiring layers 8, and the temperature during collective laminating hot-pressing is a temperature equal to or lower than the melting point of the thermoplastic resin of the insulating layers 6 and higher than the melting point of the conductor connection films 28.

With this configuration, it is easy to simultaneously perform bonding of the printed wiring boards constituting the multilayer printed wiring board 200 and a connection of the wiring layers 8 to the through-hole electrodes 10 and the conductor connection films 28 of the printed wiring boards 2c adjacent to each other in the laminating direction.

T1, which is the melting point of the thermoplastic resin, T2, which is the boiling point, decomposition temperature or sublimation temperature of the reducing agent, and T3, which is the melting point of the metal constituting the conductor connection film 28, preferably satisfy the relationship of T2≤T3<T1. This makes it possible to volatilize the reducing agent and to prevent damage to the structure of the insulating layers 6 due to excessive heat while melting the metal constituting the conductor connection films 28 during collective laminating hot-pressing.

In the printed wiring board 2 and the multilayer printed wiring board 200 of this embodiment, the through-hole electrode 10 penetrating the insulating layer 6 is provided inside the insulating layer 6. Since the printed wiring board 2 and the multilayer printed wiring board 200 have the through-hole electrode 10, a three-dimensional circuit connection for connecting an element such as a capacitor and a circuit becomes possible.

In the method for manufacturing the multilayer printed wiring board 200 according to this embodiment, it is possible to simultaneously perform thermal fusion bonding between the insulating layers 6 constituting the multilayer printed wiring board 200 and a connection of the wiring layers 8 to the through-hole electrodes and the conductor connection films 28 of the printed wiring boards 2c adjacent to each other in the laminating direction as shown in FIG. 5(b). As a result, a multilayer printed wiring board 200 can be easily manufactured.

The present invention is not limited to the above-described embodiment, and various modifications can be made within the scope of the present invention.

For example, a capacitor or an inductor may be previously prepared and embedded inside the printed wiring board 2 or the multilayer printed wiring board 200 shown in FIG. 1. Further, the capacitor or the inductor may be manufactured at the same time as the printed wiring board 2 or the multilayer printed wiring board 200 shown in FIG. 1.

For example, in the above-described embodiment, the thermal fusion bonding between the insulating layers 6 of the printed wiring boards 2c and the connection of the wiring layers 8 to the through-hole electrodes 10 and the conductor connection films 28 of the printed wiring boards 2c adjacent to each other in the laminating direction are simultaneously performed as shown in FIG. 5(b), but the method for manufacturing the multilayer printed wiring board 200 is not limited to this. For example, the multilayer printed wiring board 200 may be manufactured by previously preparing a plurality of laminated units each including two printed wiring boards 2c in which heat fusion bonding between the insulating layers 6 and a connection between the wiring layers 8 and the through-hole electrodes 10 adjacent to each other in the laminating direction are performed. The hot-pressing when laminating these laminated units in this manner is also included in the collective laminating hot-pressing.

For example, although the powder 6*a* containing the reducing agent is used in the above-described embodiment, a timing at which the reducing agent is contained in the sheet-like insulating layer 6 is not particularly limited. For example, the reducing agent may be added to the sheet-like insulating layer 6 before the sheet-like insulating layer 6 is formed and the collective laminating hot-pressing is performed. When the reducing agent is added to the sheet-like insulating layer 6, it is preferable that the concentration of the reducing agent in the sheet-like insulating layer 6, including the reducing agent to be added later, is within the above-described ranges.

For example, in the method for manufacturing the multilayer printed wiring board 200 described above, four printed wiring boards 2*c* (single-sided wiring boards for multilayer printed wiring board) are collectively laminated, but the number of the printed wiring boards 2*c* to be collectively laminated is not particularly limited, and for example, 2 to 25 layers of the printed wiring boards 2*c* can be laminated.

Hereinafter, the present invention will be described more specifically with reference to examples, but the present invention is not limited to these examples.

EXAMPLES

Sample 1 and Sample 2

Figure 8:
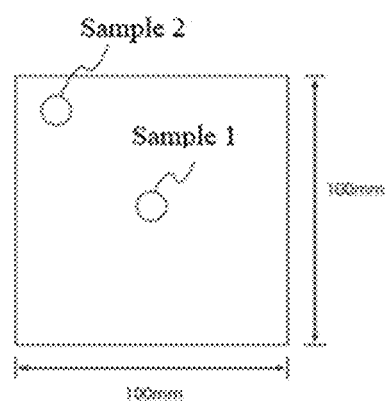
FIG. 8(a) and FIG. 8(b) is conceptual diagrams showing samples of an embodiment, where
Figure 8:
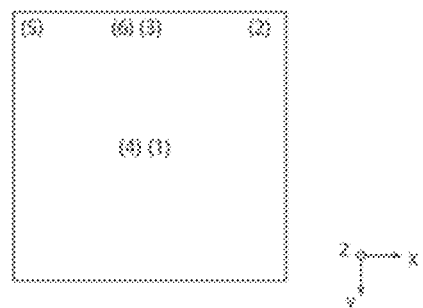

The powder 6*a* containing the liquid crystal polymer was coated to the shaping place 52 by moving the powder 6*a* in the vertical direction as shown in FIG. 6(*a*), and then hot-pressing was performed as shown in FIG. 6(*b*), so as to produce a liquid crystal polymer sheet similar to the insulating layer 6. The electrostatic screen printing method was used for coating. As shown in FIG. 8(*a*), the size of the liquid crystal polymer sheet was a square with sides of 100 mm and a thickness of 0.05 mm. The center of the liquid crystal polymer sheet was regarded as Sample 1, and the upper left thereof was regarded as Sample 2.

An LCP powder (a content rate of the LCP is 99.99 mass % or more) was used as the powder 6*a*.

The temperature was 350° C. and the pressure was 5 MPa during sheet shaping hot-pressing.

Sample 1 and Sample 2 were measured by the wide-angle X-ray diffraction method (also referred to as fine X-ray diffraction). Apparatus and measurement conditions used for the wide-angle X-ray diffraction method are as follows.

X-ray diffraction apparatus: D8 DISCOVER μHR Hybrid manufactured by Bruker AXS

Output: 50 kV, 22 mA

Slit system: 1 mmφ pinhole

Detector: Two-dimensional detector (Vantec500)

Camera length: About 10 cm

Figure 9:
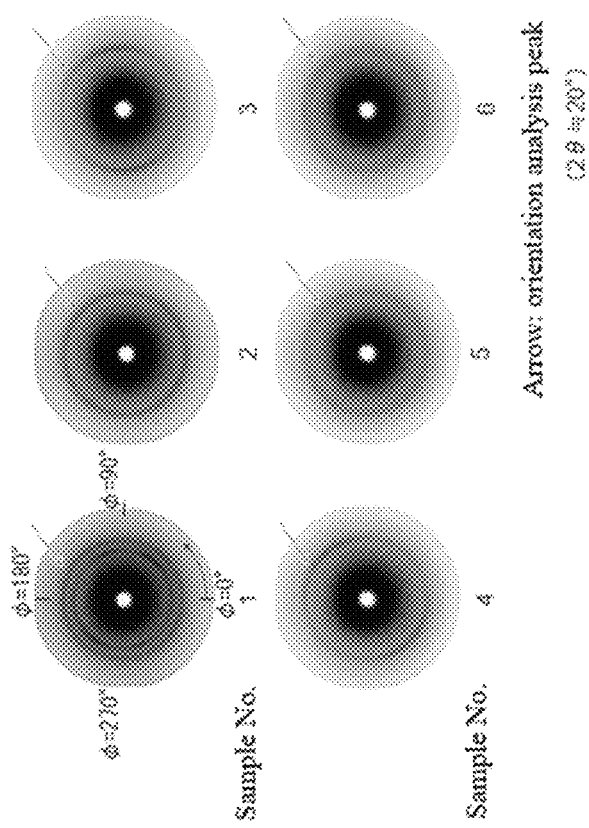
FIG. 9 is an image diagram of a two-dimensional analysis image of each sample.
Figure 10:
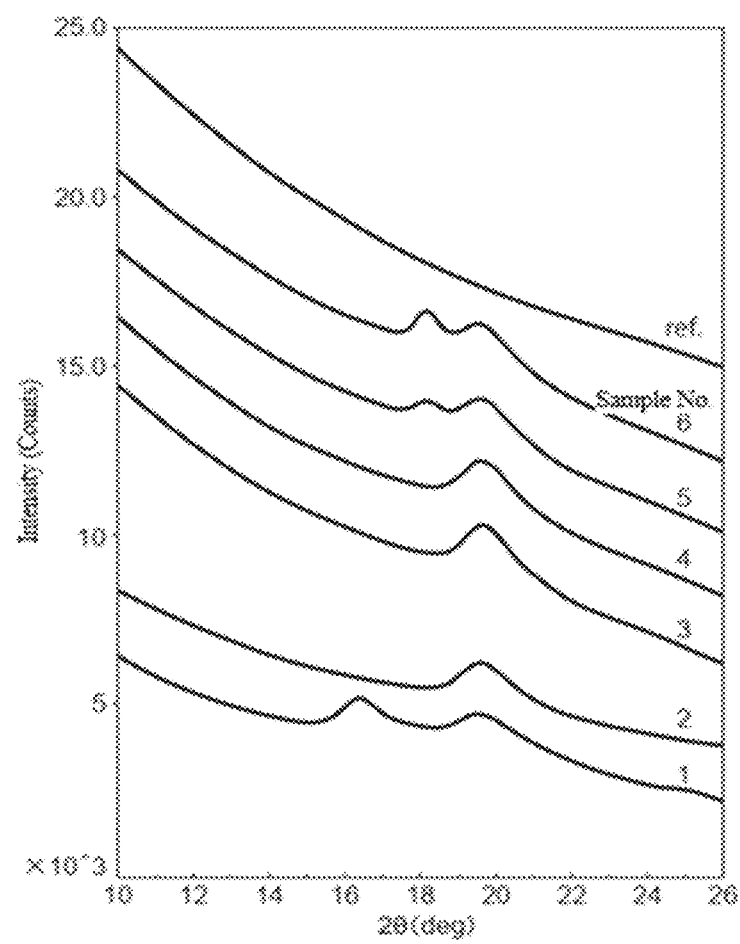
FIG. 10 is a 2θ profile (annular integral) of each sample.
Figure 11:
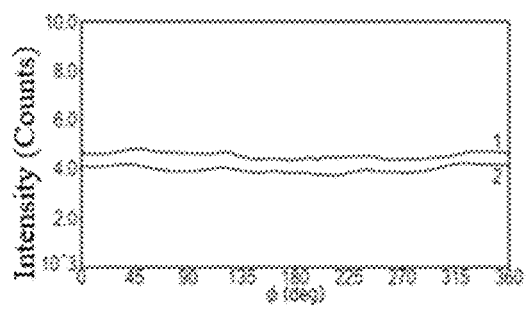
FIG. 11(a)-FIG. 11(c) is a circumferential (φ) profile around 2θ=20° of each sample.
Figure 11:
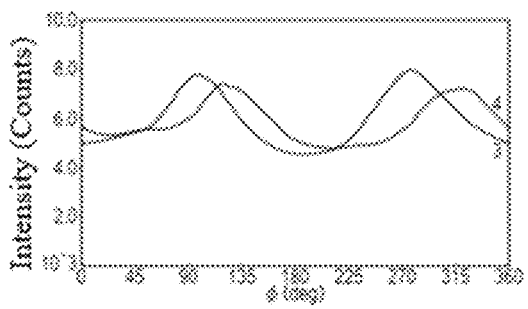
Figure 11:
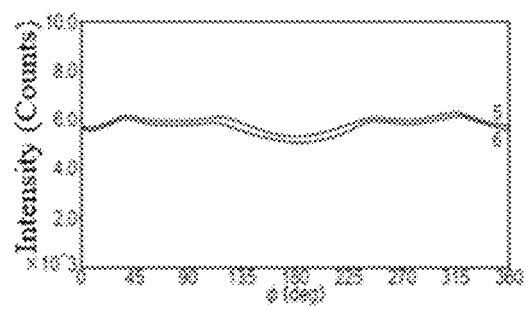

Measurement range: $2\theta=0°$, $\omega=0°$ (transmission measurement), total: 1 frame Integrating time: 300 seconds/frame Two-dimensional diffraction images of Samples 1 and 2 are shown in FIG. 9 together with other samples. In addition, 2θ profiles (annular integrations) of Samples 1 and 2 are shown in FIG. 10 together with other samples. Circumferential (φ) profiles of peaks around $2\theta=20°$ of Samples 1 and 2 are shown in FIG. 11(*a*). (A cutting range of the direction profile of the peak was set to around $2\theta=20°$ because such angle is a peak angle at which a diffraction intensity is the largest in a crystal structure of the LCP, which is an optimum angle for measuring orientation.)

Figure 12:
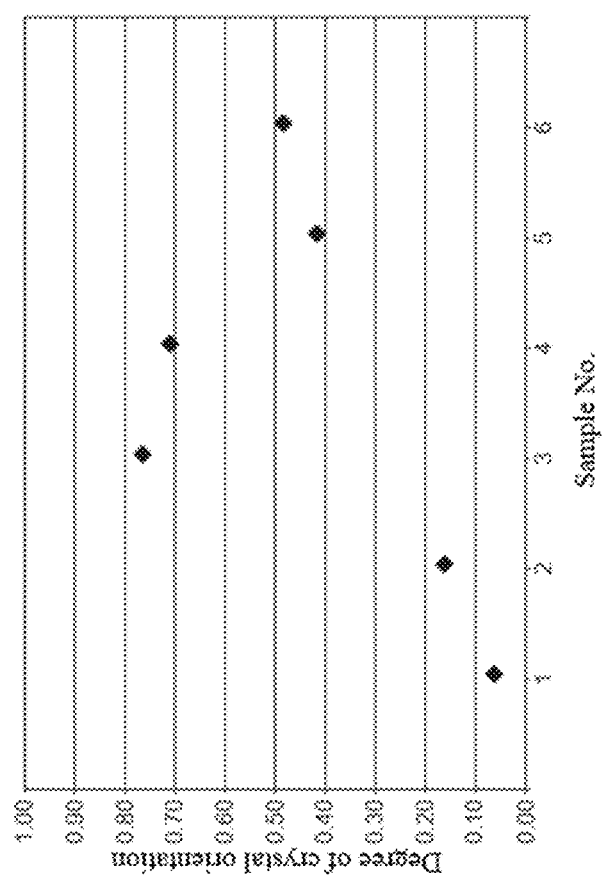
FIG. 12 is a graph comparing orientation intensities of each sample.

Further, the maximum peak areas and the minimum peak areas were calculated from the circumferential (φ) profiles shown in FIG. 11(*a*), and then applied to a right side of Equation 1 to calculate the degrees of crystal orientation of Sample 1 or Sample 2 (Table 1 and FIG. 12).

In addition, regarding the liquid crystal polymer sheet similar to the liquid crystal polymer sheet from which Samples 1 and 2 were obtained, as shown in FIG. 8(*b*), linear expansion coefficients (0 to 100° C.) in an X direction were measured at three positions, i.e., (1) the center, (2) the upper right corner, and (3) the central portion of the upper side. Similarly, linear expansion coefficients (0 to 100° C.) in a Y direction were measured at three positions, i.e., (4) the center, (5) the upper left corner, and (6) the central portion of the upper side. A maximum linear expansion coefficient difference in the plane of the liquid crystal polymer sheet was obtained by subtracting a minimum value from a maximum value among the total of six linear expansion coefficients (0 to 100° C.) (Table 2).

Sample 3 and Sample 4

As shown in FIG. 7(*a*), after the powder 6*a* containing the liquid crystal polymer was piled up into a mountain shape on the shaping place 52, the powder 6*a* was spread flat and coated by moving the powder 6*a* in the plane direction. Further, a liquid crystal polymer sheet similar to that of Sample 1 and Sample 2 was produced by hot-pressing as shown in FIG. 7(*b*). A size of the liquid crystal polymer sheet is the same as that of Sample 1 and Sample 2 shown in FIG. 8(*a*). The center of the liquid crystal polymer sheet was regarded as Sample 3, and the upper left thereof was regarded as Sample 4.

Components of the powder 6*a* used for producing Sample 3 and Sample 4 are the same as those in Sample 1 and Sample 2. Conditions of the sheet shaping hot-pressing are also the same as those in Sample 1 and Sample 2.

Sample 3 and Sample 4 were also measured by the wide-angle X-ray diffraction method in the same manner as Samples 1 and 2. Two-dimensional diffraction images of Samples 3 and 4 are shown in FIG. 9 together with other samples. In addition, 2θ profiles (annular integrations) of Samples 3 and 4 are shown in FIG. 10 together with other samples. Circumferential (φ) profiles of peaks around $2\theta=20°$ of Samples 3 and 4 are shown in FIG. 11(*b*).

Further, the maximum peak areas and the minimum peak areas were calculated from the circumferential (φ) profiles shown in FIG. 11(*b*), and then applied to the right side of Equation 1 to calculate the degrees of crystal orientation of Sample 3 or Sample 4 (Table 1 and FIG. 12).

In addition, similarly to Samples 1 and 2, regarding the liquid crystal polymer sheet similar to the liquid crystal polymer sheet from which Samples 3 and 4 were obtained, a maximum linear expansion coefficient difference in the plane was measured as shown in FIG. 8(*b*) (Table 2).

Sample 5 and Sample 6

A commercially available liquid crystal polymer film having a predetermined size (manufacturing method: a biaxial stretching method) was used, and the center was regarded as Sample 5 and the upper left was regarded as Sample 6. A chemical formula of the liquid crystal polymer is the same as those of Sample 1 to Sample 4.

Sample 5 and Sample 6 were also measured by the wide-angle X-ray diffraction method in the same manner as Samples 1 to 4. Two-dimensional diffraction images of Samples 5 and 6 are shown in FIG. 9 together with other samples. In addition, 2θ profiles (annular integrations) of Samples 5 and 6 are shown in FIG. 10 together with other samples. Circumferential (φ) profiles of peaks around 2θ=20° of Samples 5 and 6 are shown in FIG. 11(c).

Further, the maximum peak areas and the minimum peak areas were calculated from the circumferential (φ) profiles shown in FIG. 11(c), and then applied to the right side of Equation 1 to calculate the degrees of crystal orientation of Sample 5 or Sample 6 in the plane direction (Table 1 and FIG. 12).

TABLE 1

| Sample | Peak φ (deg.) | Peak 2θ (deg.) | Background intensity d (Å) | Peak area | Half width peak (deg.) | Degree of crystal orientation | Peak intensity Maximum/minimum |
|---|---|---|---|---|---|---|---|
| 1 | 47.5 | 19.58 | 4.5338 | 199521 | 3.165 | 0.07 | Maximum intensity |
|   | 172.5 | 19.8 | 4.4839 | 185085 | 2.074 |   | Minimum intensity |
| 2 | 186.5 | 19.86 | 4.4705 | 142668 | 1.86 | 0.17 | Minimum intensity |
|   | 323 | 19.7 | 4.5065 | 172420 | 1.834 |   | Maximum intensity |
| 3 | 187.5 | 19.77 | 4.4907 | 93993 | 1.702 | 0.78 | Minimum intensity |
|   | 278 | 19.62 | 4.5247 | 421376 | 1.763 |   | Maximum intensity |
| 4 | 120 | 19.63 | 4.5224 | 336268 | 1.835 | 0.72 | Maximum intensity |
|   | 214.5 | 19.68 | 4.511 | 103590 | 1.683 |   | Minimum intensity |
| 5 | 178 | 19.77 | 4.4907 | 136744 | 1.692 | 0.43 | Minimum intensity |
|   | 315.5 | 19.79 | 4.4862 | 237875 | 2.081 |   | Maximum intensity |
| 6 | 180 | 19.74 | 4.4974 | 137695 | 1.82 | 0.49 | Minimum intensity |
|   | 316 | 19.68 | 4.511 | 271120 | 2.403 |   | Maximum intensity |

Data such as peak positions, peak areas, and crystal orientation intensities of Samples 1 to 6 calculated from FIGS. 11(a) to (c) are summarized in Table 1, and a graph obtained by comparing the crystal orientation intensities of Samples 1 to 6 is shown in FIG. 12. As can be understood from FIG. 12, when the powder 6a was coated in the vertical direction by the electrostatic printing method to form the sheet as shown in FIG. 6, the degree of crystal orientation was 0.3 or less in each of Sample 1 at the center of the sheet and Sample 2 at the corner of the sheet. That is, it was confirmed that by moving the powder 6a in the vertical direction by the electrostatic printing method to form the insulating layer 6, the molecular orientation of the liquid crystal polymer was in a random state with few deviations.

Meanwhile, as shown in FIG. 7, when the powder 6a was coated by moving the powder 6a in the plane direction or in the oblique direction to form the sheet, the degree of crystal orientation was greater than 0.3 in each of Sample 3 at the center of the sheet and Sample 4 at the corner of the sheet. In addition, the degrees of crystal orientation were also greater than 0.3 in Samples 5 and 6 obtained from the commercially available liquid crystal polymer sheet using the biaxial stretching method. It was confirmed that the molecular orientation of the liquid crystal polymer in these liquid crystal polymer sheets generate deviations, and thus may generate variations in the characteristics such as the dielectric constant or the dielectric loss when used as the bamse member of the printed wiring board.

Table 2 summarizes measurement results of the linear expansion coefficients. From Table 2, it can be understood that the liquid crystal polymer film of Sample 1 or Sample 2 produced by coating the powder 6a in the vertical direction by the electrostatic printing method has small variations in the linear expansion coefficients depending on measurement positions (the maximum linear expansion coefficient difference is 18.7) and uniform thermal and mechanical properties in the plane direction. In contrast, it can be understood that the liquid crystal polymer film of Sample 3 or Sample 4 produced by coating the powder 6a by moving it in the plane direction or the oblique direction has large variations in the linear expansion coefficients depending on the measurement positions.

TABLE 2

|  | Linear expansion coefficient at each position on a sheet surface (ppm/° C.) | | | | | | Maximum linear expansion coefficient difference |
|---|---|---|---|---|---|---|---|
|  | (1) | (2) | (3) | (4) | (5) | (6) | (ppm/° C.) |
| Samples 1 and 2 | 38.6 | 41.2 | 30.1 | 22.5 | 25.4 | 35.6 | 18.7 |
| Samples 3 and 4 | 51.5 | 51.7 | 24.9 | 36.8 | 44.2 | 83.5 | 58.6 |

REFERENCE SIGNS LIST 2 printed wiring board
2c printed wiring board (single-sided)
200 multilayer printed wiring board
3 first main surface
4 second main surface
6 insulating layer
6a powder
7 conductor portion
72 unevenness
8 wiring layer
9 conductor layer
9a upper wiring layer
10 through-hole electrode
20 support substrate
22 base conductor film
24 first resist film
26 second resist film
26a through-hole
27 third resist film
28 conductor connection film 29 frame body
40 hot-pressing device
50 screen printing machine
52 shaping place
54 squeegee
56 screen mesh

What is claimed is:

1. A printed wiring board comprising a base member of a liquid crystal polymer having wiring formed on at least one surface, wherein
the printed wiring board comprising an insulating layer including the liquid crystal polymer and a conductor portion including a wiring layer having a predetermined pattern line width, wherein
the molecular orientation of the liquid crystal polymer is random in the insulating layer, and wherein
a degree of crystal orientation of the liquid crystal polymer is 0.3 or less in a plane direction of the insulating layer,
wherein the degree of crystal orientation is calculated from the following equation from a two-dimensional diffraction image obtained by a wide-angle X-ray diffraction method:

degree of crystal orientation=(maximum peak area−minimum peak area)/maximum peak area, wherein the maximum peak area is an integrated value of a peak intensity at the maximum intensity peak, and the minimum peak area is an integrated value of a peak intensity at the minimum intensity peak.

2. The printed wiring board according to claim 1, comprising:
the insulating layer having a first main surface and a second main surface which have mutually parallel plane directions, and comprising a liquid crystal polymer having a degree of crystal orientation of 0.3 or less in each of the plane directions; and
the conductor portion including the wiring layer extending parallel to the second main surface and exposed from the second main surface, and a through-hole electrode extending from the wiring layer to the first main surface, at least a part of the conductor portion being embedded in the insulating layer to penetrate from the first main surface to the second main surface.

3. The printed wiring board according to claim 2, wherein the insulating layer comprises a reducing agent.

4. The printed wiring board according to claim 2, wherein the conductor portion comprises a conductor connection film on a top surface of the through-hole electrode, and the conductor connection film includes at least one selected from Sn, Ag, Sn—Ag, Cu—Ag, or Sn—Cu.

5. A multilayer printed wiring board, comprising:
a plurality of the printed wiring boards according to claim 2, wherein
the printed wiring boards are laminated such that the first main surface of one of the printed wiring boards and the second main surface of another of the printed wiring boards are in contact with each other.

6. The printed wiring board according to claim 2, wherein the insulating layer has a degree of crystal orientation of the liquid crystal polymer less than 0.2 in a plane direction.

7. The printed wiring board according to claim 2, wherein the insulating layer has a linear expansion coefficient difference less than 18.7 ppm/° C. in a plane direction.

8. The printed wiring board according to claim 2, wherein the wiring layer is embedded in the insulating layer, wherein
one surface of the wiring layer is substantially flush with the second main surface, and wherein
the through-hole electrode is formed on another surface of the wiring layer.

9. A method for manufacturing the printed wiring board according to claim 1, comprising the steps of: forming a conductor portion having a predetermined pattern; coating a powder containing a liquid crystal polymer to a shaping place to move the powder in a vertical direction by dry coating; and hot-pressing the powder at a temperature equal to or higher than a melting point of the liquid crystal polymer.

10. The method for manufacturing a printed wiring board according to claim 9, wherein
in coating the powder, the conductor portion is disposed in the shaping place, and the powder is coated so as to fill at least a part of unevenness of the conductor portion.

11. The method for manufacturing the printed wiring board according to claim 9, wherein
the dry coating in coating the powder is electrostatic coating.

12. The printed wiring board according to claim 1, wherein
the insulating layer has a degree of crystal orientation of the liquid crystal polymer less than 0.2 in a plane direction.

13. The printed wiring board according to claim 1, wherein
the insulating layer has a linear expansion coefficient difference less than 18.7 ppm/° C. in a plane direction.

* * * * *